(12) United States Patent
Enya et al.

(10) Patent No.: US 12,184,034 B2
(45) Date of Patent: Dec. 31, 2024

(54) LASER MODULE

(71) Applicant: Sumitomo Electric Industries, Ltd., Osaka (JP)

(72) Inventors: Yohei Enya, Osaka (JP); Yuki Nakamura, Itami (JP); Hiromi Nakanishi, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 544 days.

(21) Appl. No.: 17/607,419

(22) PCT Filed: May 20, 2020

(86) PCT No.: PCT/JP2020/019960
§ 371 (c)(1),
(2) Date: Oct. 29, 2021

(87) PCT Pub. No.: WO2020/255611
PCT Pub. Date: Dec. 24, 2020

(65) Prior Publication Data
US 2022/0224072 A1 Jul. 14, 2022

(30) Foreign Application Priority Data
Jun. 17, 2019 (JP) ................. 2019-111892

(51) Int. Cl.
H01S 5/00 (2006.01)
H01L 23/10 (2006.01)
(Continued)

(52) U.S. Cl.
CPC ............ *H01S 5/0236* (2021.01); *H01L 23/10* (2013.01); *H01S 5/02212* (2013.01);
(Continued)

(58) Field of Classification Search
CPC ............... H01S 5/0236; H01S 5/02212; H01S 5/0222; H01S 5/02255; H01S 5/024;
(Continued)

(56) References Cited

U.S. PATENT DOCUMENTS

2005/0242359 A1* 11/2005 Yoshida ............. H01S 5/02212
257/99
2008/0049800 A1 2/2008 Hasegawa et al.
2011/0280266 A1* 11/2011 Hayashi ............. H01S 5/02216
438/26
2012/0033695 A1* 2/2012 Hayashi ................ H01S 5/0232
372/43.01
(Continued)

FOREIGN PATENT DOCUMENTS

JP H11-14876 A 1/1999
JP 2004-289010 A 10/2004
(Continued)

*Primary Examiner* — Kinam Park
(74) *Attorney, Agent, or Firm* — XSENSUS LLP

(57) ABSTRACT

A laser module includes a base, a carrier mounted on the base, a laser diode mounted on the carrier, an organic adhesive layer provided between the laser diode and the carrier, the organic adhesive layer having an exposed portion exposed between the laser diode and the carrier, a cap fixed to the base, the cap covering the carrier, the laser diode, and the organic adhesive layer, and a cover material covering at least a part of the exposed portion of the organic adhesive layer.

18 Claims, 11 Drawing Sheets

(51) Int. Cl.
*H01S 5/02212* (2021.01)
*H01S 5/0222* (2021.01)
*H01S 5/02255* (2021.01)
*H01S 5/0236* (2021.01)
*H01S 5/024* (2006.01)
*H01S 5/028* (2006.01)
*H01S 5/40* (2006.01)
*H01S 5/02253* (2021.01)

(52) U.S. Cl.
CPC ........ *H01S 5/0222* (2013.01); *H01S 5/02255* (2021.01); *H01S 5/024* (2013.01); *H01S 5/02415* (2013.01); *H01S 5/0282* (2013.01); *H01S 5/4012* (2013.01); *H01S 5/0021* (2013.01); *H01S 5/02253* (2021.01)

(58) Field of Classification Search
CPC ............... H01S 5/02415; H01S 5/0282; H01S 5/4012; H01S 5/0021; H01S 5/02253; H01L 23/10
See application file for complete search history.

(56) References Cited

U.S. PATENT DOCUMENTS

| | | |
|---|---|---|
| 2012/0033696 A1 | 2/2012 | Hayashi et al. |
| 2015/0103856 A1* | 4/2015 | Hagino ............... H01S 5/02345 |
| | | 372/44.01 |
| 2016/0285232 A1* | 9/2016 | Reinert ................. H01S 5/4025 |
| 2017/0141531 A1 | 5/2017 | Kyono et al. |
| 2019/0044302 A1* | 2/2019 | Kanskar ................ H01S 5/0237 |
| 2019/0097722 A1* | 3/2019 | McLaurin ........... H01S 5/34333 |

FOREIGN PATENT DOCUMENTS

| | | |
|---|---|---|
| JP | 2006-104046 A | 4/2006 |
| JP | 2009-009075 A | 1/2009 |
| JP | 2011-003889 A | 1/2011 |
| JP | 2012-38819 A | 2/2012 |
| JP | 2012-60039 A | 3/2012 |
| JP | 2012-178434 A | 9/2012 |
| JP | 2013-225658 A | 10/2013 |
| JP | 2017-98301 A | 6/2017 |
| WO | 2005/119862 A1 | 12/2005 |

* cited by examiner

LASER MODULE

CROSS-REFERENCE TO RELATED APPLICATIONS

The present application is based on PCT filing PCT/JP2020/019960, filed May 20, 2020, which claims priority to JP 2019-111892, filed on Jun. 17, 2019, the entire contents of each are incorporated herein by reference.

TECHNICAL FIELD

The present disclosure relates to a laser module.

BACKGROUND ART

Examples of the light source device include a device in which a laser diode corresponding to a light emitting element and a lens for collimating laser light from the laser diode are mounted on a substrate. Japanese Patent Application Laid-Open No. 2004-289010 discloses that the vapor pressure of the Si organic compound gas in the package is set to $5.4 \times 10^2 N/m^2$ or less from the viewpoint of suppressing the characteristic deterioration of the light source device. In Japanese Patent Application Laid-Open No. 2004-289010, using an adhesive having a small amount of volatile gas for adjusting the vapor pressure is used.

CITATION LIST

Patent Literature

Patent Literature 1: Japanese Unexamined Patent Publication No. 2004-289010

SUMMARY OF INVENTION

A laser module according to an aspect of the present disclosure includes a base, a carrier mounted on the base, a laser diode mounted on the carrier, an organic adhesive layer provided between the laser diode and the carrier, the organic adhesive layer having an exposed portion exposed between the laser diode and the carrier, a cap fixed to the base, the cap covering the carrier, the laser diode, and the organic adhesive layer, and a cover material covering at least a part of the exposed portion of the organic adhesive layer.

DESCRIPTION OF EMBODIMENTS

Problems to Be Solved by Disclosure

Figure 1:
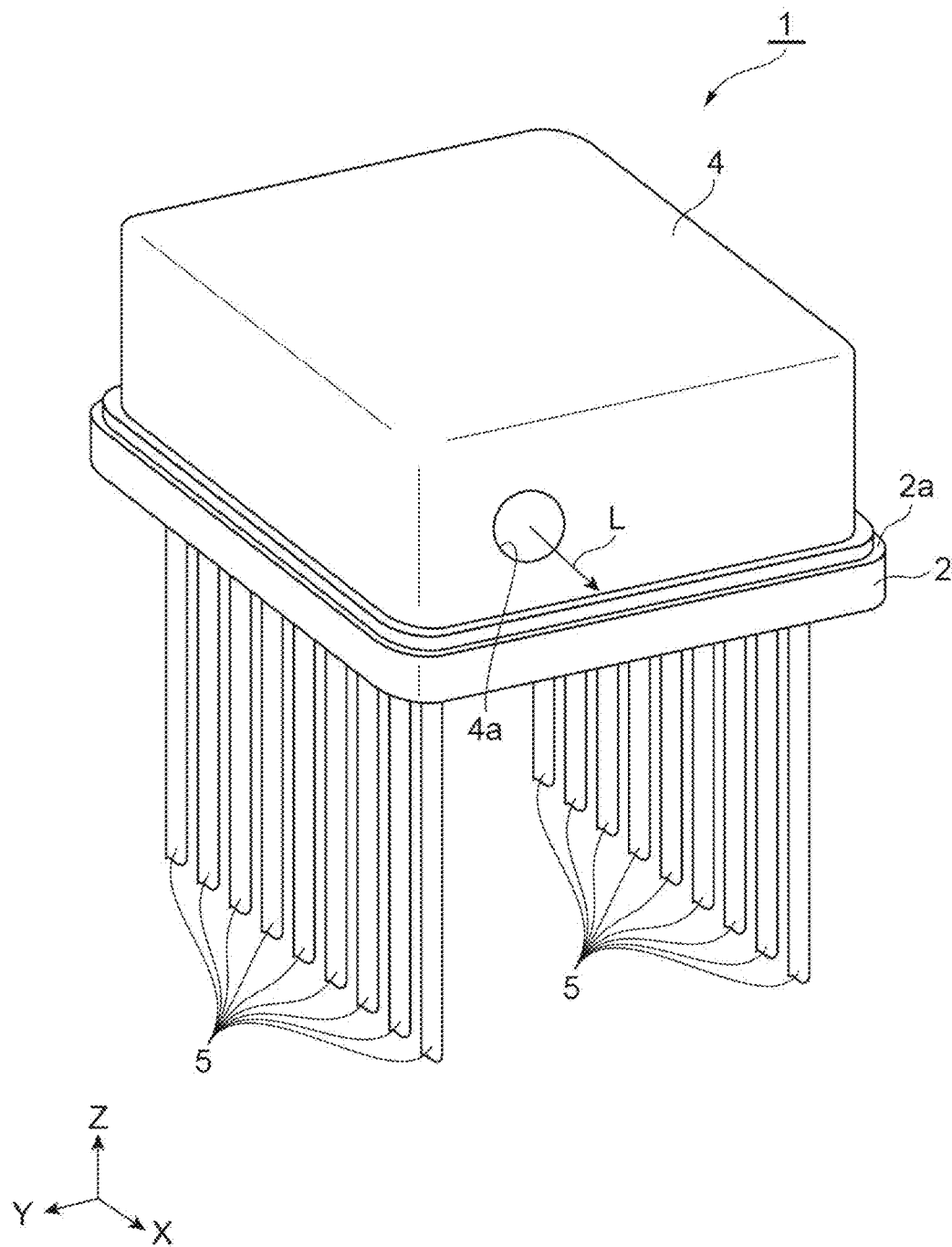
FIG. 1 is a perspective view illustrating a laser module according to an first embodiment.

In the case where an adhesive layer including an adhesive whose amount of volatile gas is small is used, a variety of an organic compound included in the adhesive layer is limited. Thus, for example, problems such as loss of freedom of design occur. In view of such problems, it is an object of the present disclosure to provide a laser module capable of suppressing characteristic deterioration due to gas of an organic compound without limiting the variety of the organic compound included in an adhesive layer.

Effects of the Present Disclosure

According to the present disclosure, it is possible to provide a laser module capable of suppressing characteristic deterioration due to gas of an organic compound without limiting the variety of the organic compound included in an adhesive layer.

Description of Embodiments of Present Disclosure

First, contents of embodiments of the present disclosure will be listed and described. An embodiment of the present disclosure is a laser module including a base, a carrier mounted on the base, a laser diode mounted on the carrier, an organic adhesive layer provided between the laser diode and the carrier, the organic adhesive layer having an exposed portion exposed from between the laser diode and the carrier, a cap fixed to the base, the cap covering the carrier, the laser diode, and the organic adhesive layer, and a cover material covering at least a part of the exposed portion of the organic adhesive layer.

In this laser module, at least a part of an exposed portion of the organic adhesive layer, which is exposed between the carrier and the laser diode, is covered with a cover material. Such a cover material can prevent an organic compound included in the organic adhesive layer from volatilizing into an interior space defined by the base and the cap. Thus, vapor pressure of organic compound gas in the interior space can be reduced without limiting the components of the organic compound included in the organic adhesive layer.

Therefore, according to the laser module, it is possible to suppress the characteristic deterioration due to the gas of the organic compound without limiting the variety of the organic compound included in the organic adhesive layer.

In one embodiment, the emission wavelength of the laser diode may be 500 nm or less. The characteristic deterioration of the laser diode due to the volatilized organic compound gas is likely to be more remarkable as the emission wavelength of the laser diode is shorter. Therefore, by using the laser module, the laser diode can exhibit good characteristics for a long time even when the emission wavelength of the laser diode is 500 nm or less.

Another embodiment of the present disclosure is a laser module including a base, a carrier mounted on the base, an organic adhesive layer provided between the carrier and the base, the organic adhesive layer having an exposed portion exposed from between the carrier and the base, a cap fixed to the base, the cap covering the carrier, the laser diode, and the organic adhesive layer, and a cover material covering at least a part of the exposed portion of the organic adhesive layer.

In this laser module, at least a part of an exposed portion of the organic adhesive layer exposed between the carrier and the base is covered with a cover material. Such a cover material can prevent an organic compound included in the organic adhesive layer from volatilizing into an interior space defined by the base and the cap. Therefore, vapor pressure of gas of the organic compound in the interior space can be reduced without limiting the components of the organic compound included in the organic adhesive layer. Therefore, according to the laser module, it is possible to suppress the characteristic deterioration due to the gas of the organic compound without limiting the variety of the organic compound included in the organic adhesive layer.

In one embodiment, the cover material may also cover at least a part of the base. In this case, since the cover material is less likely to be peeled off, the function of preventing volatilization of the organic compound gas obtained by the cover material can be maintained for a long time. In addition, since volatilization of the organic compound attached to a surface of the base can be suppressed, the vapor pressure of the organic compound gas in the interior space can be favorably reduced. Moreover, a temperature adjust element may be provided inside the carrier.

Still another embodiment of the present disclosure is a laser module including a base, a carrier mounted on the base, a laser diode mounted on the carrier, an optical element mounted on the carrier, an organic adhesive layer provided between the optical element and the carrier, the organic adhesive layer having an exposed portion exposed between the optical element and the carrier, a cap fixed to the base, the cap covering the carrier, the laser diode, the optical element and the organic adhesive layer, and a cover material covering at least a part of the exposed portion of the organic adhesive layer.

In this laser module, at least a part of an exposed portion of the organic adhesive layer, which is exposed between the carrier and the optical element, is covered with a cover material. Such a cover material can prevent an organic compound included in the organic adhesive layer from volatilizing into an interior space defined by the base and the cap. Thus, vapor pressure organic compound gas in the interior space can be reduced without limiting the components of the organic compound included in the organic adhesive layer. Therefore, according to the laser module, it is possible to suppress the characteristic deterioration due to the gas of the organic compound without limiting the variety of the organic compound included in the organic adhesive layer.

In one embodiment, the cover material may also cover at least a part of the carrier. In this case, since the cover material is less likely to be peeled off, the function of preventing volatilization of the organic compound gas obtained by the cover material can be maintained for a long time. Moreover, since volatilization of the organic compound attached to the surface of the carrier can be suppressed, the vapor pressures of the organic compound gas in the interior space can be favorably reduced.

In one embodiment, the cover material may cover whole of the exposed portion of the organic adhesive layer. In this case, volatilization of the organic compound gas into the interior space can be favorably suppressed.

In one embodiment, the cover material may include silicon oxide. In this case, the organic adhesive layer may include the organic compound including at least one of Si and O, and the silicon oxide may include at least one of Si and O included in the organic compound. In this case, since the silicon oxide included in the cover material can have a dense molecular structure, volatilization of the organic compound gas from the organic adhesive layer can be favorably suppressed.

Description of Embodiments of Present Disclosure

A specific example of a laser module according to an embodiment of the present disclosure will be described below with reference to the figures. Note that the present disclosure is not limited to these examples, but is defined by the scope of the claims, and is intended to include all modifications within the meaning and scope equivalent to the scope of the claims In the following description, the similar elements or elements having the same function will be denoted by the same reference symbol, and an overlapping description will be omitted.

First Embodiment

Figure 2:
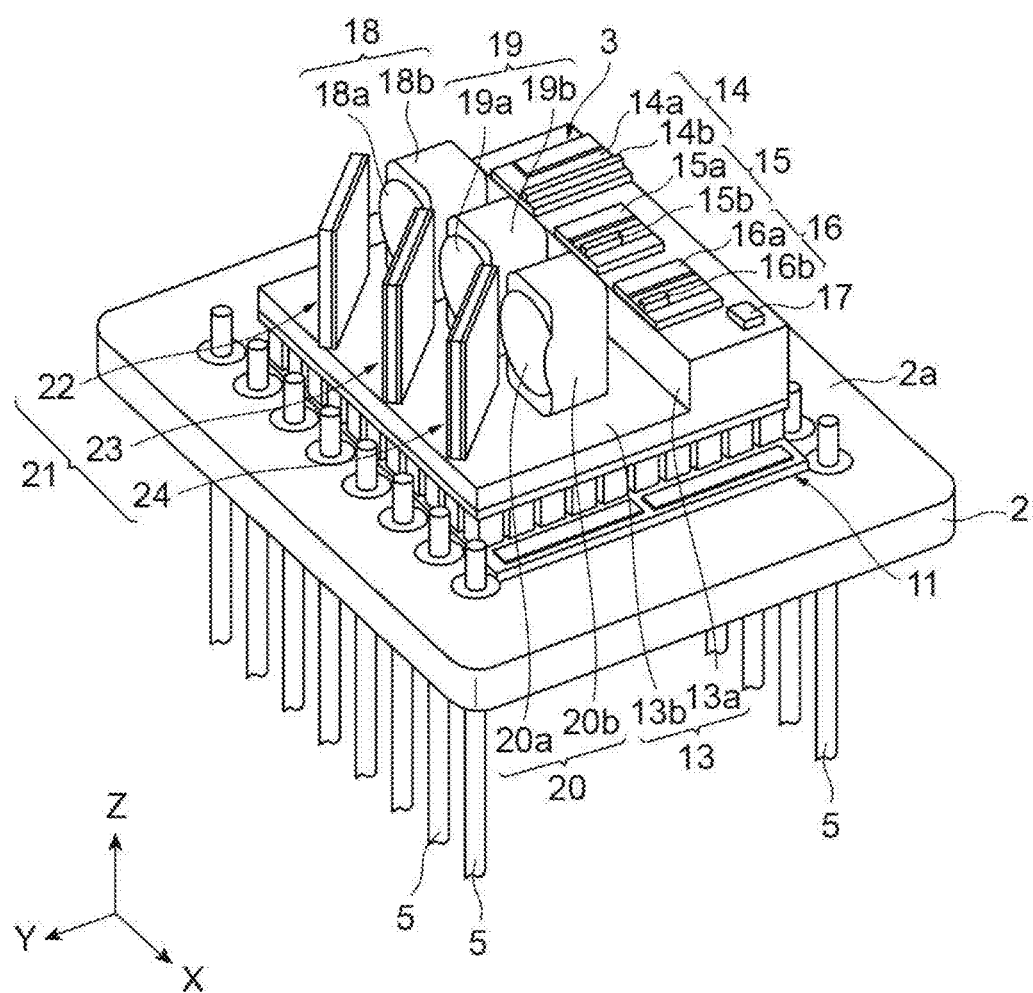
FIG. 2 is a perspective view showing a state in which a cap is removed from the laser module of FIG. 1.
Figure 3:
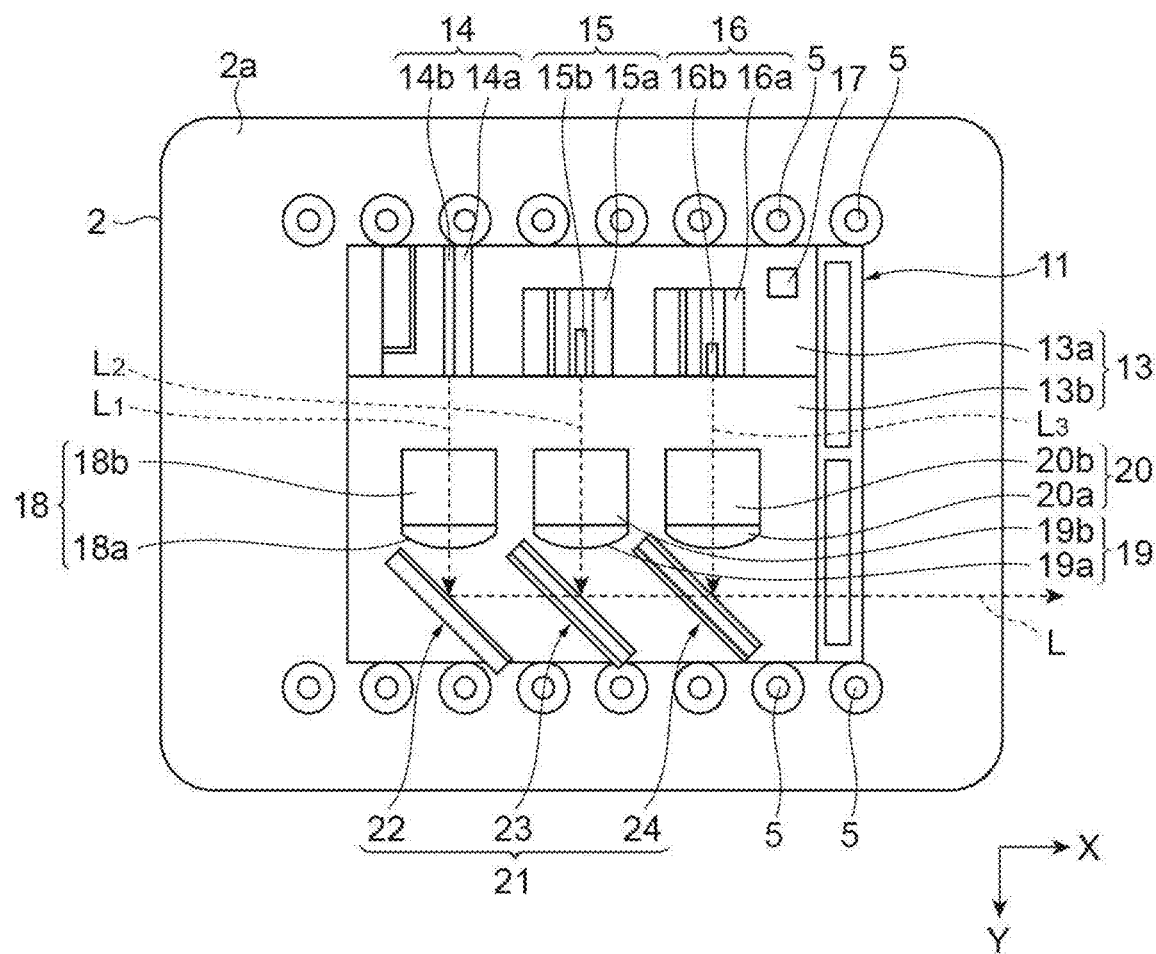
FIG. 3 is a plan view of FIG. 2.
Figure 4A:
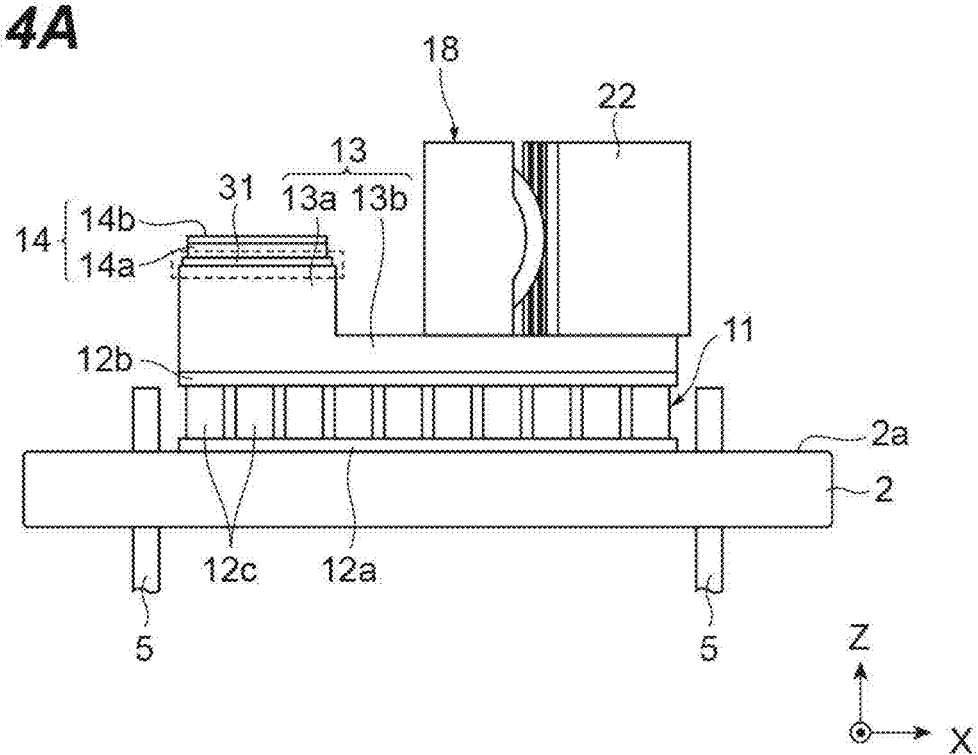
FIG. 4A is a side view of FIG. 2.

FIG. 1 is a perspective view illustrating a laser module according to an first embodiment. FIG. 2 is a perspective view showing a state in which a cap is removed from the laser module of FIG. 1. FIG. 3 is a plan view of FIG. 2. FIG. 4A is a side view of FIG. 2. The laser module 1 shown in FIGS. 1 to 4A is a light source device that oscillates laser light L, and is used in, for example, a head-up display mounted on a vehicle. The laser light L is, for example, multiplexed light multiplexed in the laser module 1. The laser module 1 includes a base 2 as a part of a package, a light source portion 3, and a cap 4 as another part of the package. The package is an exterior of the laser module 1.

Hereinafter, the emission direction of the laser light L in a plan view is referred to as a direction X, the direction intersecting or orthogonal to the direction X in a plan view is referred to as a direction Y, and the direction intersecting or orthogonal to the directions X and Y in a plan view is referred to as a direction Z. In the first embodiment, the directions X, Y, and Z are orthogonal to each other, and the direction Z corresponds to a direction in which base 2 and cap 4 overlap. The plan view corresponds to a view from the direction Z.

The base 2 is a member having a primary face 2a on which the light source portion 3 is placed. A plurality of lead pins 5 extending in the direction Z are passed through the base 2. The plurality of lead pins 5 are members for connecting the light source portion 3 and an external device. The plurality of lead pins 5 include, for example, a signal supply lead pin, a current supply lead pin, and a GND lead pin.

For example, a part of the plurality of lead pins 5 is located on one side of the light source portion 3 in the direction Y, and the other part of the plurality of lead pins 5 is located on the other side of the light source portion 3 in the direction Y. Each lead pin 5 is electrically insulated from the base 2. On the primary face 2a, a wiring and the like for connecting the light source portion 3 and the lead pin 5 is actually provided, but illustration thereof is omitted. Similarly, the wiring and the like included in the light source portion 3 are not shown.

The light source portion 3 is a portion that emits laser light L, and includes a thermo-electric cooler (TEC) 11, a carrier 13, laser diodes (LDs) 14 to 16, a thermistor 17, lenses 18 to 20, and a multiplex optical system 21.

The TEC 11 is a temperature adjusting element that adjusts the temperature of the LDs 14 to 16 and the like, and is fixed to the primary face 2a of the base 2. The TEC 11 is, for example, a Peltier element. The TEC 11 is fixed to the base 2 via an adhesive such as silver (Ag) paste. In the present specification, an adhesive or the like may be or may not be used for fixing different members to each other.

The TEC 11 includes substrates 12a and 12b and a thermoelectric element 12c located between the substrates 12a and 12b. The substrate 12a is a member fixed to the base 2 via the adhesive. The substrate 12b is a member that supports the carrier 13, the LDs 14 to 16, the thermistor 17, the lenses 18 to 20, and the multiplex optical system 21, and is disposed on the substrate 12a via the thermoelectric element 12c. Each of the substrates 12a and 12b has, for example, a quadrangular shape in a plan view. The substrates 12a and 12b exhibit an insulating property. The substrates 12a and 12b are ceramic substrates such as alumina substrates and AlN substrate. The substrates 12a and 12b and the thermoelectric element 12c such as BiTE are fixed via, for example, metal electrodes evaporated on the surfaces of the substrates 12a and 12b and solder (not shown). The metal electrodes are, for example, Au electrodes, and the solder is, for example, AuSn or SNsb.

The carrier 13 is a member that supports the LDs 14 to 16, the thermistor 17, the lenses 18 to 20, and the multiplex optical system 21, and is fixed on the TEC 11. The carrier 13 is fixed to the TEC 11 via an adhesive such as Ag paste. The carrier 13 has, for example, substantially the same shape as the substrate 12b of the TEC 11 in a plan view. The carrier 13 is made of, for example, metal or ceramics. The metal forming the carrier 13 is, for example, Cu, and the ceramic forming the carrier 13 is, for example, AlN. When the carrier 13 is made of a ceramic, a conductive member may be provided in the carrier 13. The carrier 13 includes a first portion 13a on which the LDs 14 to 16 and the thermistor 17 are mounted, and a second portion 13b on which the lenses 18 to 20 and the multiplex optical system 21 are mounted. The first portion 13a and the second portion 13b are arranged along the direction Y. A step is formed by the first portion 13a and the second portion 13b. In the first embodiment, from the viewpoint of optimizing the optical coupling between the LDs 14 to 16 and the lenses 18 to 20, a thickness of the first portion 13a along the direction Z is larger than a thicknesses of the second portion 13b along the direction Z. Therefore, in the direction Z, the interval between the base 2 and the LDs 14 to 16 is larger than the interval between the base 2 and the lenses 18 to 20.

The LDs 14 to 16 are light oscillation devices that emit laser lights of different colors respectively, and are arranged in parallel in the direction X. The LDs 14 to 16 are arranged in order along the direction X. Each of the optical axes of the LDs 14 to 16 extends along the direction Y. The optical axes of the LDs 14 to 16 are substantially parallel to each other.

The LD 14 is an optical oscillator that emits red laser light $L_1$, and is mounted on the carrier 13. The wavelength range of the red laser light $L_1$ emitted from the LD 14 is, for example, 610 nm to 670 nm. The LD 14 includes a submount 14a mounted on the carrier 13 and a laser oscillator 14b fixed on the submount 14a. The submount 14a is a member provided between the carrier 13 and the laser oscillator 14b, and is provided on the first portion 13a. The submount 14a includes, for example, a material having a thermal expansion coefficient close to that of a material included in the laser oscillator 14b. Examples of the material include aluminum nitride (AlN), silicon carbide (SiC), silicon (Si), and diamond. The submount 14a is fixed to the carrier 13 via an organic adhesive layer 31 (described in detail later). The laser oscillator 14b is a semiconductor device mounted on the carrier 13 via a submount 14a. The laser oscillator 14b includes, for example, a GaAs-based semiconductor.

The LD 15 is an optical oscillation device that emits green laser light $L_2$, and is mounted on the carrier 13. The wavelength range of the green laser light $L_2$ emitted from the LD 15 is, for example, 500 nm to 550 nm. The LD 15 includes a submount 15a mounted on the carrier 13 and a laser oscillator 15b fixed on the submount 15a. The submount 15a is a member provided between the carrier 13 and the laser oscillator 15b, and is provided on the first portion 13a. The submount 15a includes, for example, a material similar to that of the submount 14a, and is fixed to the carrier 13 via an adhesive layer similar to that of the organic adhesive layer 31. The laser oscillator 15b is a semiconductor device mounted on the carrier 13 via a submount 15a. The laser oscillator 15b includes, for example, a GaN-based semiconductor.

The LD 16 is an optical oscillator that emits blue laser light $L_3$, and is mounted on the carrier 13. The wavelength range of the blue laser light $L_3$ emitted from the LD 16 is 500 nm or less, for example, 410 nm to 460 nm. The LD 16 includes a submount 16a mounted on the carrier 13 and a laser oscillator 16b fixed on the submount 16a. The submount 16a is a member provided between the carrier 13 and the laser oscillator 16b, and is provided on the first portion 13a. The submount 16a includes, for example, the same material as the submounts 14a and 15a, and is fixed to the carrier 13 via an adhesive layer similar to the organic adhesive layer 31. The laser oscillator 16b is a semiconductor device mounted on the carrier 13 via a submount 16a. The laser oscillator 16b includes, for example, a GaN-based semiconductor.

The thermistor 17 is a sensor for detecting the temperature of the carrier 13. The thermistor 17 is fixed to the carrier 13 via an adhesive such as Ag paste. In a case where the carrier 13 exhibits an insulating property, a case where wire bonding to the carrier 13 is difficult, or the like, the thermistor 17 is installed on an insulating submount provided on the carrier 13, for example. The metal electrode provided on the surface of the submount is wire-bonded to the thermistor 17.

Lenses 18 to 20 are optical elements arranged so as to correspond to the LDs 14 to 16. In the first embodiment, the lenses 18 to 20 are collimator lenses that collimate (parallelize) laser light from the corresponding LDs 14 to 16, respectively. In the first embodiment, the lens 18 is disposed on the optical path of the LD 14, the lens 19 is disposed on the optical path of the LD 15, and the lens 20 is disposed on the optical path of the LD 16. Therefore, the lenses 18 to 20 are optically coupled to the LDs 14 to 16, respectively. The focal lengths of the lenses 18 to 20 are, for example, less than 5 mm.

The lens 18 has a lens function region 18*a* for collimating laser light and a holding region 18*b* for holding the lens function region 18*a*. The shape of the lens 18 is not particularly limited as long as it has a collimating function. The lens 18 is, for example, a molded product in which a lens function region 18*a* and a holding region 18*b* are integrally molded. When the material of the lens 18 is a resin, the resin is, for example, a cycloolefin polymer. The lens 18 is fixed to the carrier 13 via, for example, an adhesive. Like the lens 18, the lenses 19,20 and have lens function regions 19*a* and 20*a* and holding regions 19*b* and 20*b*, respectively.

The multiplex optical system 21 includes 3 wavelength selection filters 22 to 24. Each of the wavelength selection filters 22 to 24 is a type of optical element and is, for example, a multilayer film filter formed on a glass substrate. For example, one or more dielectric thin films are formed on each of the wavelength selection filters 22 to 24. The wavelength selection filters 22 to 24 are arranged so as to correspond to the lenses 18 to 20, respectively. Therefore, the wavelength selection filters 22 to 24 are arranged so as to correspond to the LDs 14 to 16, respectively. In the first embodiment, the wavelength selection filter 22 is located on the optical path of the red laser light $L_1$, the wavelength selection filter 23 is located on the optical path of the green laser light $L_2$, and the wavelength selection filter 24 is located on the optical path of the blue laser light $L_3$. The wavelength selection filter 22 reflects the red laser light $L_1$ collimated by the lens 18 toward the wavelength selection filter 23. The wavelength selection filter 23 transmits the red laser light $L_1$ and reflects the green laser light $L_2$ collimated by the lens 19 toward the wavelength selection filter 24. The wavelength selection filter 24 transmits the red laser light $L_1$ and the green laser light $L_2$ and reflects the blue laser light $L_3$ collimated by the lens 20. Therefore, the laser lights $L_1$ to $L_3$ output from the LDs 14 to 16 are multiplexed by the multiplex optical system 21 having the wavelength selection filters 22 to 24.

The lenses 18 to 20 and the wavelength selection filters 22 to 24 are respectively in a state in which the optical axes of the red laser light $L_1$, the green laser light $L_2$, and the blue laser light $L_3$ included in the laser light L are adjusted so as to coincide with each other.

The cap 4 shown in FIG. 1 is a member for protecting the light source portion 3, and is fixed to the primary face 2*a* of the base 2. That is, the cap 4 is a member that is fixed to the base 2 and covers the carrier 13, the LDs 14 to 16, and the like. The cap 4 is, for example, welded to the base 2 (hermetic seal). A light source portion 3 and portions of each lead pin 5 protruding from the primary face 2*a* are accommodated in an interior space of the laser module 1 defined by the base 2 and the cap 4. The cap 4 is provided with an opening 4*a* through which the laser light L passes. For example, glass or the like is airtightly fitted into the opening 4*a*.

Figure 4B:
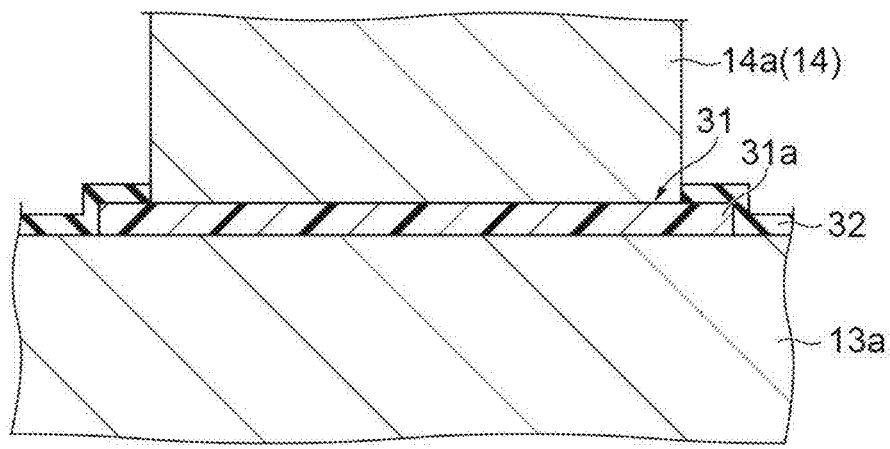
FIG. 4B is a schematic enlarged sectional view of a portion indicated by a broken line in FIG. 4A.

Next, the organic adhesive layer 31 will be described in detail with reference to FIG. 4B. FIG. 4B is a schematic enlarged sectional view of a portion indicated by a broken line in FIG. 4A.

The organic adhesive layer 31 is used for fixing the LD 14 to the carrier 13, and is a layer having at least an organic substance-containing adhesive. The organic adhesive layer 31 is formed when the LD 14 is fixed to the carrier 13 via an organic substance-containing adhesive. The organic-containing adhesive is a curable adhesive containing at least one of a low molecular organic compound and a high molecular organic compound, and is applied onto, for example, the first portion 13*a* of the carrier 13 or the submount 14*a* of the LD 14. The curable adhesive includes, for example, an ultraviolet curable resin, a thermosetting resin, or a mixture of an ultraviolet curable resin and a thermosetting resin. In the first embodiment, the organic compounds included in the organic adhesive layer 31 include at least one of Si and O. Therefore, the organic-containing adhesive includes, for example, siloxane. In the first embodiment, the organic-containing adhesive comprises at least a siloxane. The organic compound included in the organic adhesive layer 31 may volatilize due to heat generated by the operation of the LD 14 and the like, for example.

The organic adhesive layer 31 has an exposed portion 31*a* exposed from the carrier 13 and the LD 14. The exposed portion 31*a* is a portion overflowing from between the carrier 13 and the LD 14 to the outside, and is located on the first portion 13*a*. In a plan view, the exposed portion 31*a* overflows from a part or the whole of the LD 14 to the outside. In the first embodiment, the exposed portion 31*a* overflows from a whole of the LD 14 in a plan view.

The exposed portion 31*a* is covered by a cover material 32. The cover material 32 is a film member that directly or indirectly covers the exposed portion 31*a*. The cover material 32 has a single-layer structure or a multilayer structure and includes, for example, silicon oxide. In this case, the cover material 32 may include a single silicon oxide layer or may include multiple silicon oxide layers. At least one of Si and O forming the silicon oxide may be a part of Si and O included in the organic adhesive layer 31. In the first embodiment, the cover material 32 has a layer shape covering at least a part of the carrier 13 in addition to the whole of the exposed portion 31*a*. The cover material 32 is in contact with the submount 14*a* of the LD 14. Therefore, in the first embodiment, the organic adhesive layer 31 including the exposed portion 31*a* is sealed by the carrier 13, the LD 14, and the cover material 32. The silicon oxide is not limited to $SiO_2$ and may be a substance including Si and O as main components.

Next, with reference to a comparative example described below, the operation and effect achieved by the laser module 1 according to the first embodiment will be described. A laser module (not shown) according to the comparative example has the same configuration as the laser module 1 according to the first embodiment except that the cover material 32 described above is not formed.

Figure 5:
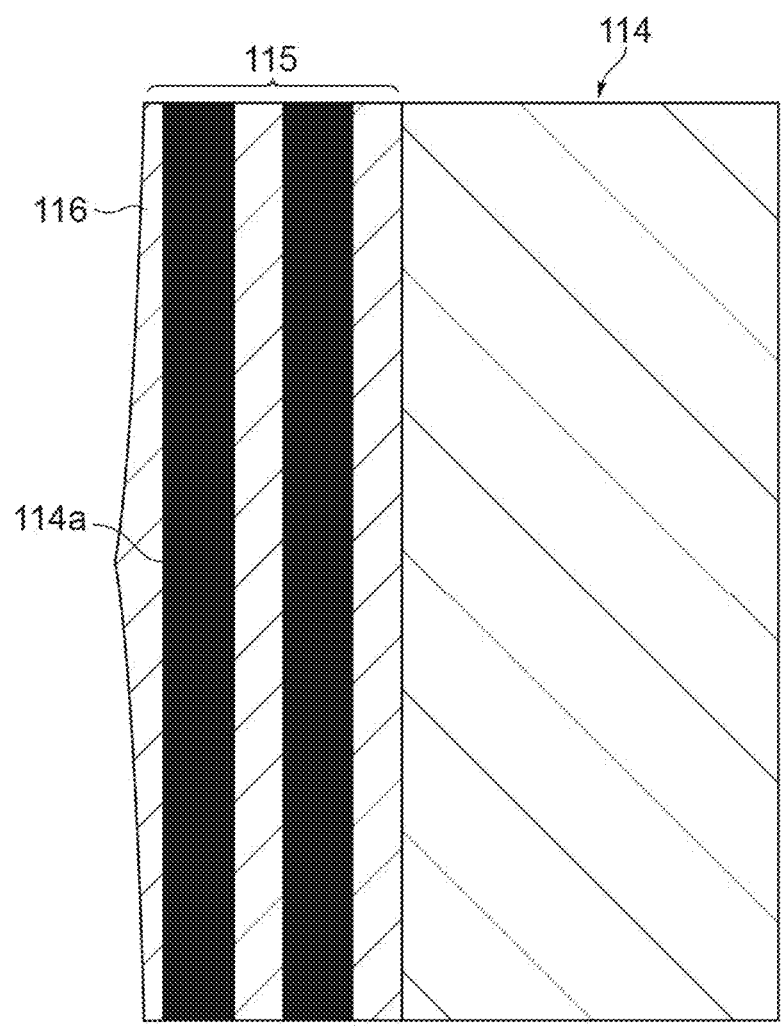
FIG. 5 is a schematic cross-sectional view showing a laser light emitting end face of an LD according to a reference example.

FIG. 5 is a schematic cross-sectional view showing a laser light emitting end face of an LD of a laser module according to the comparative example. As shown in FIG. 5, the laser light emitting end face of the LD 114 according to the comparative example is formed by a stack 115. The stack 115 is provided to adjust the reflectance of the laser light emission end face, and includes, for example, a stack of dielectric layers. A silicon oxide film 116 is provided on the laser light emitting end face of the LD 114. The silicon oxide film 116 is a deposit based on an organic compound volatilized at the interior space of the package. Thus, the silicon oxide film 116 is more easily provided as the vapor pressure of the organic compound gas in the interior space is higher. In addition, the silicon oxide film 116 is deposited on the LD 114 with the use of the laser module (i.e., oscillation of the LD). The deposit based on the organic compound is likely to aggregate in the portion 114a where the laser oscillates in the LD 114. This is because the constituent substance of the organic compound decomposed by the laser output from the LD 114 is likely to adhere to the portion 114a closest to the decomposition position of the organic compound. Therefore, the thickness of the silicon oxide film 116 is not uniform, and the portion overlapping the portion 114a is thickest. When a plurality of LDs are provided in a package, a deposit based on an organic compound is likely to be formed on an LD having a short wavelength and high energy. This is because an LD having a shorter wavelength and higher energy is more likely to decompose an organic compound. For example, an LD having an emission wavelength of 500 nm or less is likely to be deteriorated in characteristics due to the deposit.

When the silicon oxide film 116 is formed as in the comparative example, the optical path length of the LD 114 deviates from the design value. Therefore, in the laser module, the higher the vapor pressure of the organic compound gas on the interior space of the package, the more easily the laser characteristics of the LD 114 are degraded.

In contrast to the comparative example, in the laser module 1 according to the first embodiment, the exposed portion 31a of the organic adhesive layer 31 exposed from the carrier 13 and the LD 14 is covered with the cover material 32. Moreover, in the first embodiment, the exposed portion 31a is sealed by the carrier 13, the LD 14, and the cover material 32. Accordingly, the organic compound included in the organic adhesive layer 31 can be prevented from volatilizing into the interior space defined by the base 2 and the cap 4. Therefore, the vapor pressure of the organic compound gas in the interior space can be reduced without limiting the component of the organic compound included in the organic adhesive layer 31. Therefore, a deposit based on the organic compound gas is less likely to be formed on the laser light emitting end surface of the LD 14 and the like. In other words, it is possible to suppress a gap of the optical path length of the LD 14 and the like due to the use of the laser module 1. Therefore, according to the laser module 1 of the first embodiment, it is possible to suppress the characteristic deterioration due to the gas of the organic compound without limiting the variety of the organic compound included in the organic adhesive layer 31.

Figure 6A:
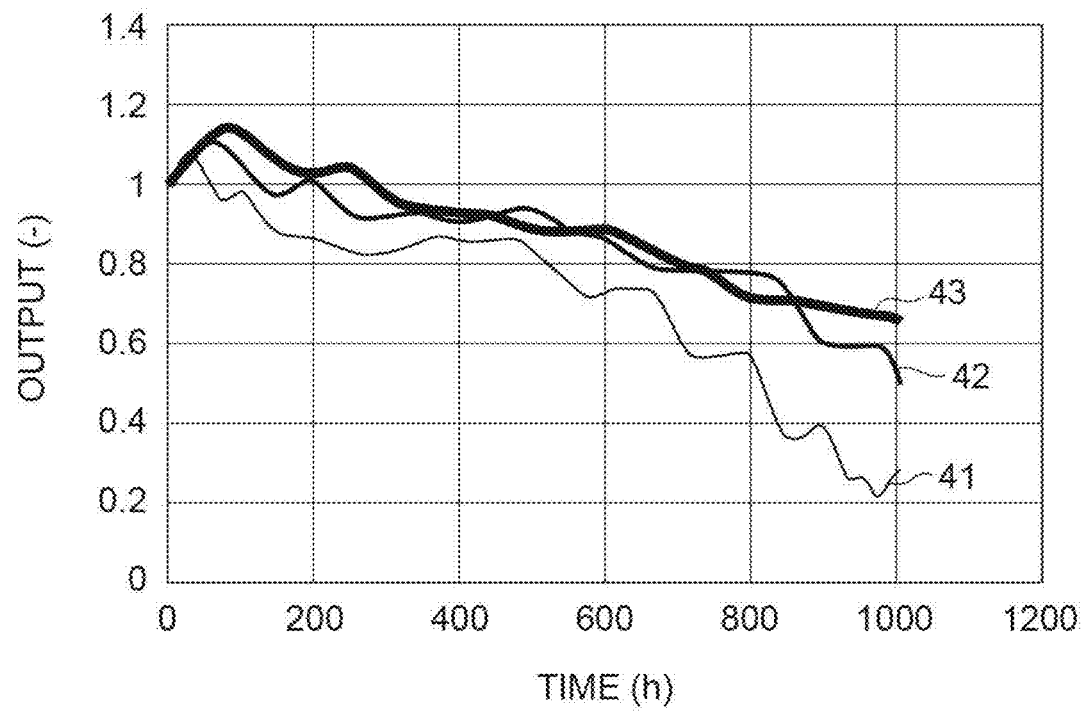
FIG. 6A is a graph showing an output variation accompanying the use of the laser module according to the comparative example.

Moreover, with reference to FIGS. 6A, 6B, and 7, the reason why the above-described effects are obtained by using the laser module 1 will be described in detail. FIG. 6A is a graph showing an output variation accompanying the use of the laser module according to the comparative example, and FIG. 6B is a graph showing an output variation accompanying the use of the laser module according to the first embodiment.

Figure 6B:
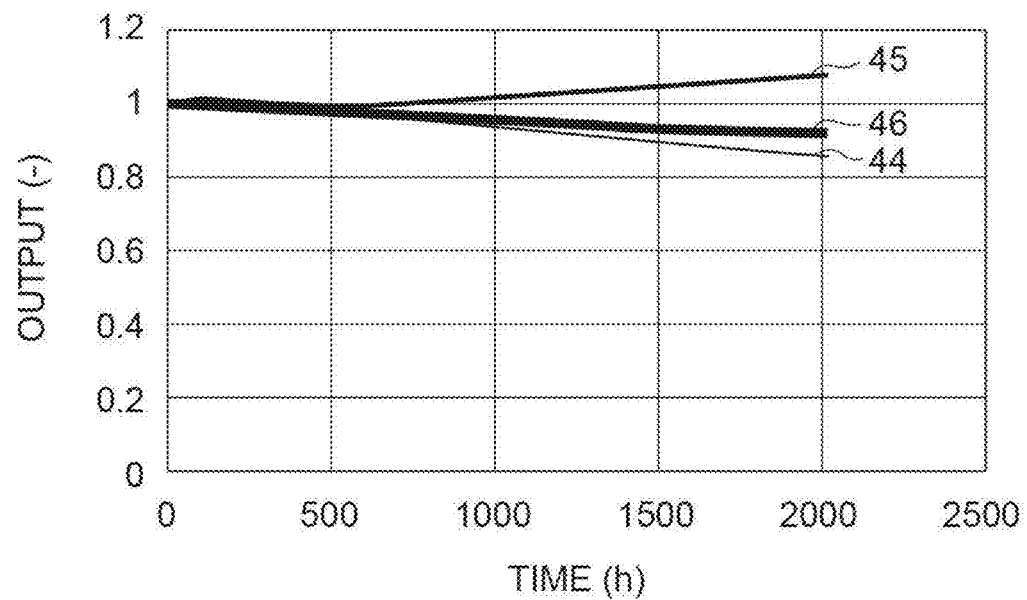
FIG. 6B is a graph showing an output variation associated with the use of the laser module according to the first embodiment.

In FIGS. 6A and 6B, the horizontal axis represents time and the vertical axis represents the output of the laser module. In FIGS. 6A and 6B, the initial output value of the laser module is 1. FIG. 6A shows data 41, 42, 43, and FIG. 6B shows data 44, 45, 46. Data 41 to 43 show the output variation results of the laser modules according to the comparative examples manufactured under the same conditions. Data 44 to 46 show the output variation results of the laser modules 1 manufactured under the same conditions. As shown in FIGS. 6A and 6B, in the comparative example, the output of the laser module decreases by 20% or more after about 700 hours. On the other hand, in the first embodiment, the output reduction of the laser module is less than 20% even after about 2000 hours. From the above results, it can be seen that the output reduction rate associated with the use of the laser module is improved by covering the organic adhesive layer 31 with the cover material 32.

Figure 7:
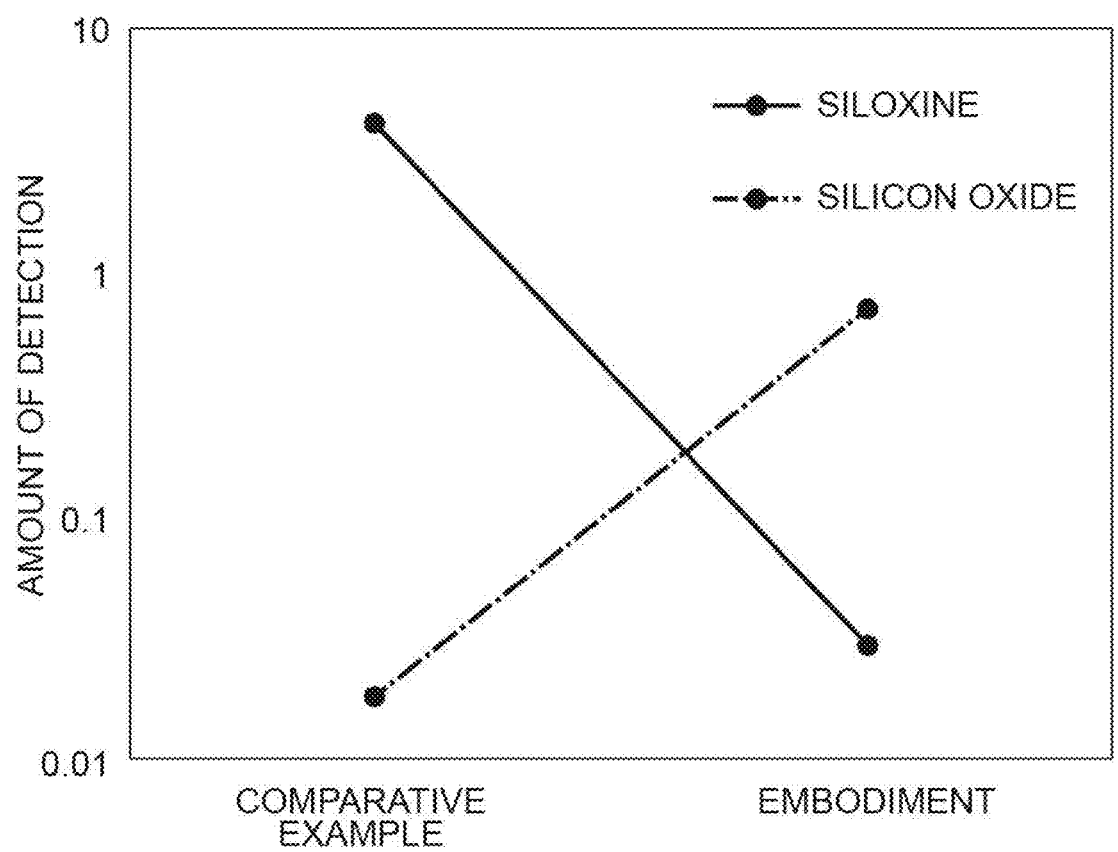
FIG. 7 is a view showing the results of measuring the carrier surfaces of the laser modules according to the comparative example and the first embodiment by TOF-SIMS.

FIG. 7 is a view showing the results of measuring the carrier surfaces of the laser modules according to the comparative example and the first embodiment by TOF-SIMS. In the TOF-SIMS, an analyzer "PHI nanoTOF II (registered trademark)" manufactured by ULVAC-PHI, Inc. was used. The measurement conditions of TOF-SIMS were a raster size of 500 μm square, a first ion species of $Bi^{3+}$, and a first ion acceleration voltage of 30 kV. In FIG. 7, the vertical axis represents the amount of detection of substance. In FIG. 7, the amount of detection of silicon oxide in the first embodiment is 1. As shown in FIG. 7, in the comparative example, a large number of siloxanes were present on the carrier surface, while silicon oxide was hardly present. On the other hand, in the first embodiment, a large number of silicon oxides were present on the carrier surfaces, while siloxane was hardly present. From the above results, it can be seen that siloxane, which is the material of the silicon oxide film deposited on the laser light emitting end face of the LD, is less likely to exist inside the package by covering the organic adhesive layer 31 with the cover material 32. In other words, a silicon oxide film based on siloxane included in the organic adhesive layer 31 is less likely to be formed on the laser light emitting end surface of the LD by covering the organic adhesive layer 31 with the cover material 32. Therefore, from the results shown in FIGS. 6A and 6B and FIG. 7 as well, it can be seen that, according to the laser module 1 of the first embodiment, it is possible to suppress the characteristic deterioration due to the gas of the organic compound without limiting the variety of the organic compound included in the organic adhesive layer 31.

In the first embodiment, the cover material 32 also covers at least a part of the carrier 13. In this case, since the cover material 32 is less likely to be peeled off, the function of preventing volatilization of the organic compound gas obtained by the cover material 32 can be maintained for a long time. In addition, since volatilization of the organic compound attached to the surface of the carrier 13 can be suppressed, the vapor pressure of the organic compound gas on the interior space of the package can be favorably reduced. In addition, the cover material 32 may cover a part of the LD 14 in addition to the carrier 13. In this case, the cover material 32 is more difficult to peel off. Furthermore, since the volatilization of the organic compound attached to the surface of the LD 14 can be suppressed, the vapor pressure of the organic compound gas in the interior space of the package can be more favorably reduced.

In the first embodiment, the cover material 32 covers the whole of the exposed portion 31a of the organic adhesive layer 31. Therefore, the organic compound gas is less likely to volatilize. That is, according to the first embodiment, the characteristic deterioration of the laser module 1 can be favorably suppressed.

In the first embodiment, cover material 32 may include silicon oxide. In this case, the organic adhesive layer 31 may include at least one of Si and O, and the silicon oxide may include at least one of Si and O. In this case, since the silicon oxide included in the cover material 32 can have a dense molecular structure, volatilization of the organic compound gas from the organic adhesive layer 31 can be favorably suppressed. In other words, it is possible to improve the function of preventing volatilization of the organic compound gas obtained by the cover material 32.

Next, modifications of the first embodiment will be described with reference to FIGS. 8A and 8B. Hereinafter, only configurations different from those of the above-described embodiment will be described, and descriptions of configurations identical to those of the above-described first embodiment will be omitted.

Figure 8A:
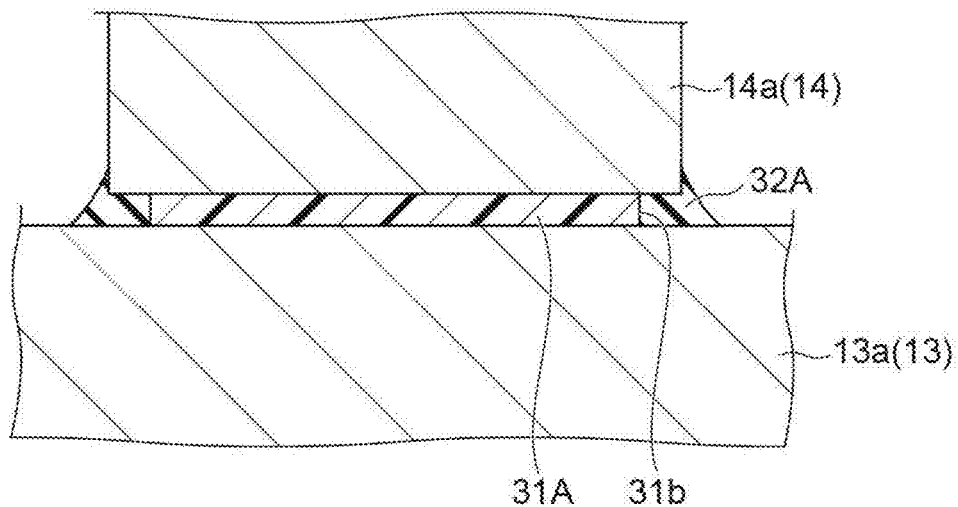
FIG. 8A is an enlarged cross-sectional view of a main part of a laser module according to a first modification.

FIG. 8A is an enlarged cross-sectional view of a main part of a laser module according to a first modification. As shown in FIG. 8A, the submount 14a of the LD 14 is fixed on the first portion 13a of the carrier 13 via an organic adhesive layer 31A. In the first modification, the organic adhesive layer 31A does not overflow from the LD 14 in a plan view. Therefore, the organic adhesive layer 31A according to the first modification has an exposed face 31b which is an exposed portion exposed from the carrier 13 and the LD 14. The exposed face 31b is covered with a cover material 32A. The cover material 32A is provided in the space between the carrier 13 and the LD 14, and is in contact with the exposed face 31b. An organic adhesive layer 31A is provided in a space sealed by the cover material 32A, the carrier 13, and the LD 14. Even in such a first modification, the same operational effects as those of the first embodiment described above are exhibited.

Figure 8B:
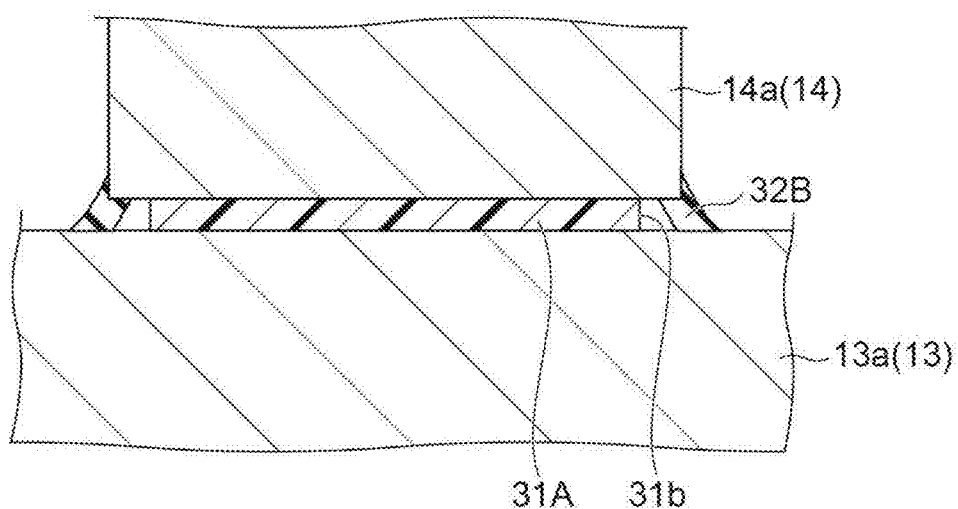
FIG. 8B is an enlarged cross-sectional view of a main part of a laser module according to a second modification.

FIG. 8B is an enlarged cross-sectional view of a main part of a laser module according to a second modification. As shown in FIG. 8B, unlike the cover material 32A of the first modification, the cover material 32B is spaced apart from the exposed face 31b and indirectly covers the organic adhesive layer 31A. In the second modification, the organic adhesive layer 31A is provided in the space sealed by the cover material 32B, the carrier 13, and the LD 14. Even in such a second modification, the same operational effects as those of the first embodiment described above are exhibited.

Second Embodiment

Hereinafter, the laser module according to the second embodiment will be described. In the description of the second embodiment, description overlapping with the first embodiment will be omitted, and portions different from the first embodiment will be described. That is, the description of the first embodiment may be appropriately applied to the second embodiment within a technically possible range.

Figure 9A:
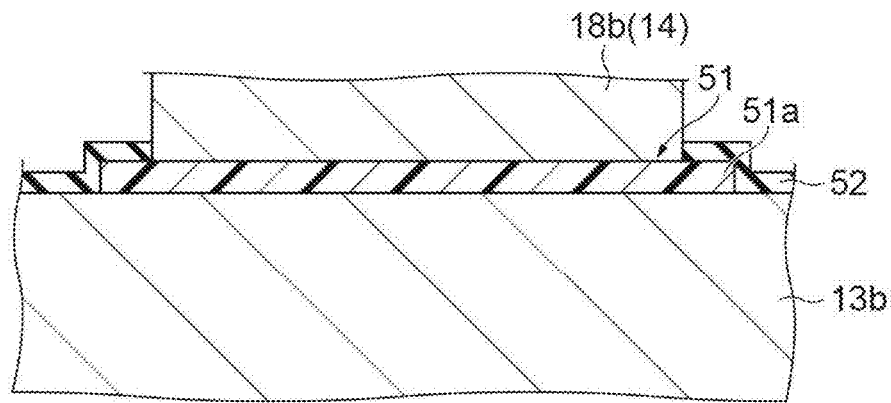
FIG. 9A is an enlarged cross-sectional view of a main part of the laser module according to the second embodiment.

FIG. 9A is an enlarged cross-sectional view of a main part of the laser module according to the second embodiment. In the second embodiment, an organic adhesive layer is used to fix a lens, which is an optical element, and a carrier. In detail, as shown in FIG. 9A, an organic adhesive layer 51 is provided between the second portion 13b of the carrier 13 and the holding resin 18b of the lens 18. The organic adhesive layer 51 is made of the same material as the organic adhesive layer 31 and has an exposed portion 51a. The exposed portion 51a is covered by a cover material 52. The cover material 52 is a film member that directly or indirectly covers the exposed portion 51a, and has the same configuration as the cover material 32. The cover material 52 covers at least a part of the carrier 13 in addition to the whole of the exposed portion 51a. The cover material 52 is in contact with the lens 18. Therefore, in the second embodiment, the organic adhesive layer 51 including the exposed portion 51a is sealed by the carrier 13, the lens 18, and the cover material 52. The cover material 52 may be formed at the same time as the cover material 32, or may be formed at a different timing from the cover material 32. The cover materials 32, 52 may be the same layer continuous with each other or may be layers independent of each other.

According to the laser module of the second embodiment, the same operation and effect as those of the first embodiment are achieved. In addition, volatilization of an organic compound in the interior space defined by the base 2 and the cap 4 can be favorably suppressed. In the second embodiment, an organic adhesive layer for fixing each of the lenses 19, 20 and the carrier 13 may be used. These organic adhesive layers are also covered with the cover material 52 such that volatilization of the organic compound into the interior space can be favorably suppressed.

Figure 9B:
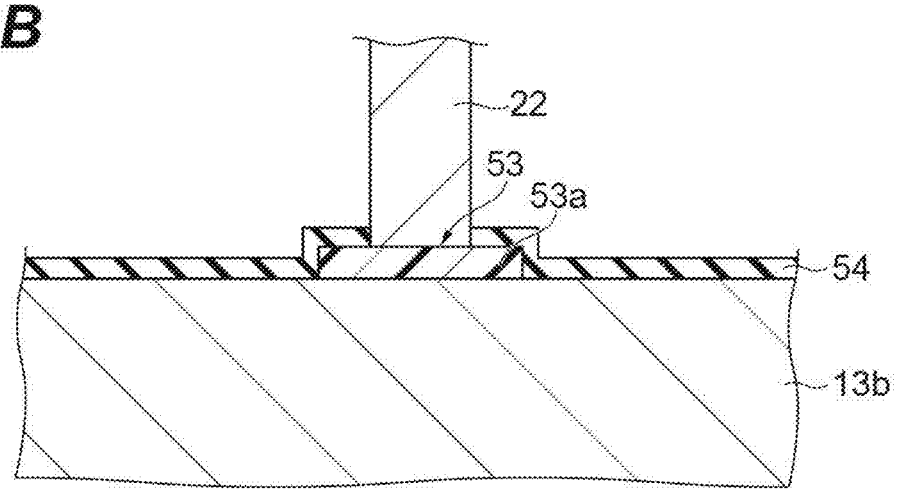
FIG. 9B is an enlarged cross-sectional view of a main part of a laser module according to a modification of the second embodiment.

FIG. 9B is an enlarged cross-sectional view of a main part of a laser module according to a modification of the second embodiment. As shown in FIG. 9B, an organic adhesive layer 53 is provided between the wavelength selection filter 22 which is an optical element and the second portion 13b of the carrier 13. The organic adhesive layer 53 is made of the same material as the organic adhesive layer 31 similarly to the organic adhesive layer 51, and has an exposed portion 53a. The exposed portion 53a is covered by a cover material 54. Specifically, the organic adhesive layer 53 including the exposed portion 53a is sealed by the carrier 13, the wavelength selection filter 22, and the cover material 54. Even in such a modification, the same operation and effect as those of the second embodiment can be achieved. In this modification, an organic adhesive layer for fixing each of the wavelength selection filters 23, 24 and the carrier 13 may be used.

These organic adhesive layers are also covered with the cover material 54, so that volatilization of organic compounds into the interior space can be favorably suppressed. The cover material corresponding to each organic adhesive layer may be a single layer or different layers.

Third Embodiment

Hereinafter, the laser module according to the third embodiment will be described. In the description of the third embodiment, the description overlapping with the first and second embodiments will be omitted, and portions different from the first and second embodiments will be described. That is, the descriptions of the first and second embodiments may be appropriately applied to the third embodiment within a technically possible range.

Figure 10A:
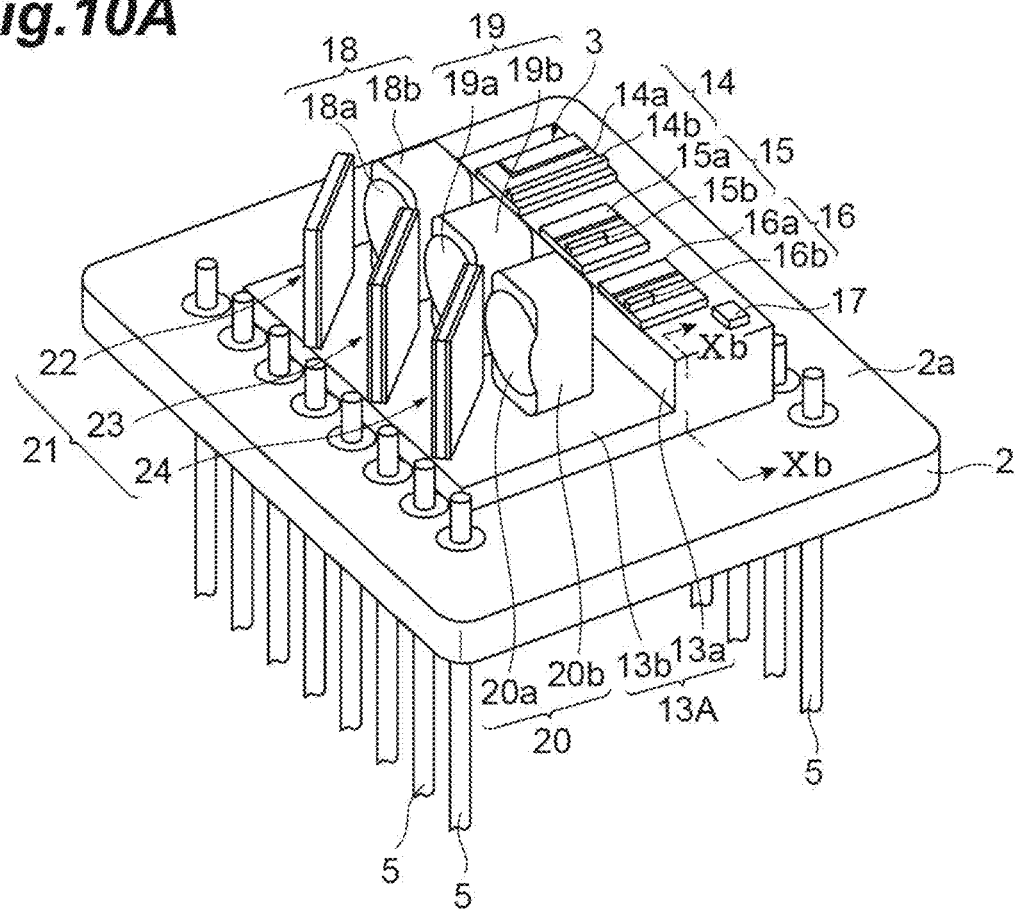
FIG. 10A is a perspective view illustrating a state in which a cap is removed from the laser module according to the third embodiment.
Figure 10B:
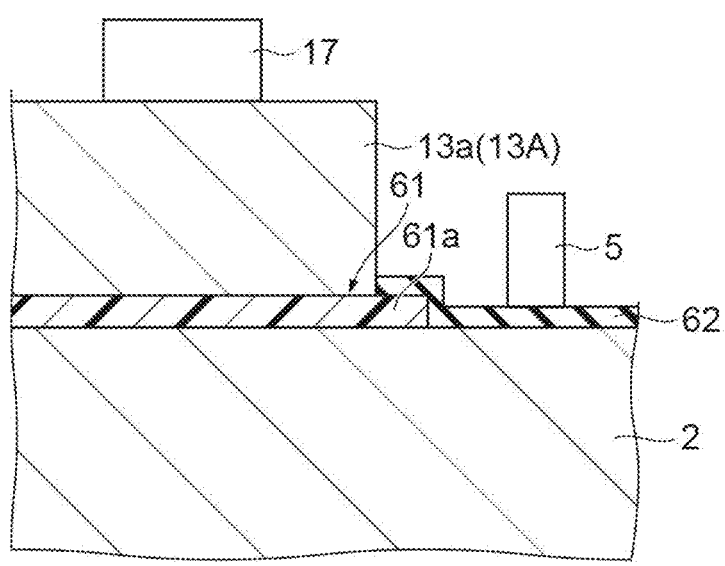
FIG. 10B is an enlarged cross-sectional view of a main part of FIG. 10A.

FIG. 10A is a perspective view illustrating a state in which a cap is removed from the laser module according to the third embodiment. FIG. 10B is an enlarged cross-sectional view of a main part of FIG. 10A. As shown in FIG. 10A, in the third embodiment, unlike the first embodiment, the TEC is not fixed to the base 2. As shown in FIG. 10B, the carrier 13A and the base 2 are fixed by an organic adhesive layer 61. The organic adhesive layer 61 is made of the same material as the organic adhesive layer 31 and has an exposed portion 61a. The exposed portion 61a is covered by a cover material 62. The cover material 62 is a film member that directly or indirectly covers the exposed portion 61a, and has the same configuration as the cover material 32. The cover material 62 covers at least a part of the base 2 in addition to the whole of the exposed portion 61a. The cover material 62 is in contact with the carrier 13A. Therefore, in the third embodiment, the organic adhesive layer 61 including the exposed portion 61a is sealed by the base 2, the carrier 13A, and the cover material 62. The cover material 62 may be formed at the same time as the cover material 32 or may be formed at a different timing from the cover material 32. The cover materials 32, 62 and may be the same layer continuous with each other or may be layers independent of each other.

According to the laser module of the third embodiment, the same operation and effect as those of the first embodiment are achieved. In addition, volatilization of the organic compound in the interior space defined by the base 2 and the cap 4 can be favorably suppressed. According to the third embodiment, a temperature adjust element may be provided in the carrier 13A.

Fourth Embodiment

Hereinafter, the laser module according to the fourth embodiment will be described. In the description of the fourth embodiment, description overlapping with the first to third embodiments is omitted, and portions different from the first to third embodiments are described. That is, the descriptions of the first to third embodiments may be appropriately used for the fourth embodiment within a technically possible range.

Figure 11A:
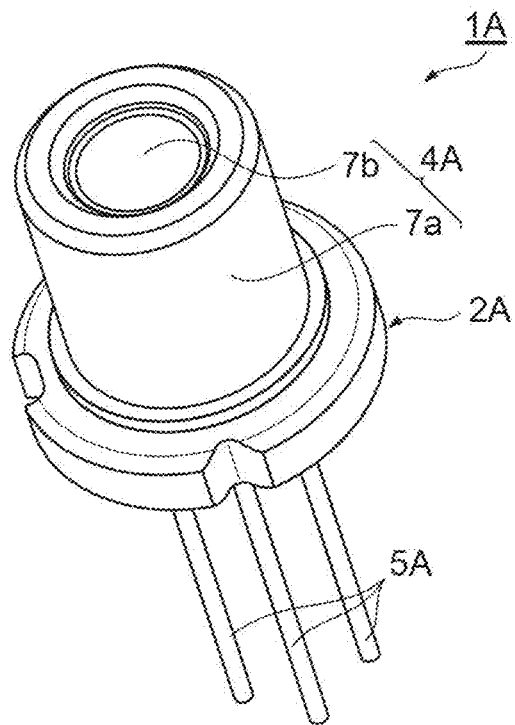
FIG. 11A is a perspective view showing a laser module according to the fourth embodiment.
Figure 11B:
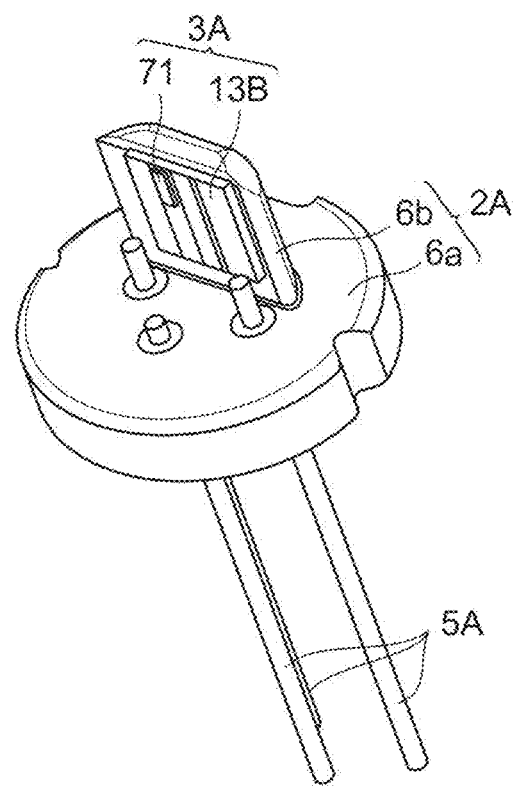
FIG. 11B is a perspective view showing a state in which the cap is removed from the laser module of FIG. 11B FIG. 11A.

FIG. 11A is a perspective view showing a laser module according to the fourth embodiment. FIG. 11B is a perspective view showing a state in which the cap is removed from the laser module of FIG. 11A. The laser module 1A shown in FIGS. 11A and 11B is a so-called CAN package type device. The laser module 1A includes a base 2A, a light source portion 3A, and a cap 4A. The base 2A includes a main portion 6a having a substantially disk shape and a protrusion 6b protruding from the main portion 6a. The main portion 6a is provided with a plurality of lead pins 5A. Protrusion 6b protrudes along a direction opposite to the direction in which lead pin 5A extends. The cap 4A includes a cover 7a having a substantially cylindrical shape and a cover glass 7b that seals one end side of the cover 7a. The other end of the cover 7a is attached to the main portion 6a of the base 2A. Protrusion 6b is sealed by main portion 6a and cap 4A.

The light source portion 3A includes a carrier 13B that functions as a submount mounted on the base 2A and an LD 71 mounted on the carrier 13B. The carrier 13B is fixed to the protrusion 6b via an adhesive. In the fourth embodiment, an organic adhesive layer (not shown) is used to fix the base 2A and the carrier 13B. Moreover, in the organic adhesive layer, an exposed portion exposed between the base 2A and the carrier 13B is covered by a cover material. The cover material is a film member that directly or indirectly covers the exposed portion, and has the same configuration as the cover material 32. The cover material covering the exposed portion exposed from the base 2A and the carrier 13B covers at least a part of the base 2A in addition to whole of the exposed portion. The cover material is in contact with the carrier 13B. Therefore, in the fourth embodiment, the organic adhesive layer including the exposed portion is sealed by the base 2A, the carrier 13B, and the cover material.

The LD 71 has an emission wavelength of 500 nm or less and is fixed to the carrier 13B via an adhesive. In the fourth embodiment, an organic adhesive layer (not shown) is used to fix the carrier 13B and the LD 71. Moreover, in the organic adhesive layer, an exposed portion exposed between the carrier 13B and the LD 71 is covered with a cover material. The cover material is a film member that directly or indirectly covers the exposed portion, and has the same configuration as the cover material 32. The cover material covering the exposed portion exposed from the carrier 13B and the LD 71 covers at least a part of the carrier 13B in addition to whole of the exposed portion. The cover material is in contact with the LD 71. Therefore, in the fourth embodiment, the organic adhesive layer including the exposed portion is sealed by the carrier 13B, the LD 71, and the cover material.

The cover material covering the exposed portion exposed from the base 2A and the carrier 13B and the cover material covering the exposed portion exposed from the carrier 13B and the LD 71 may be formed at the same time or at different timings. These cover materials may be the same layer continuous with each other or may be layers independent of each other.

According to the laser module of the fourth embodiment, the same operation and effect as those of the first embodiment are achieved. In addition, volatilization of the organic compound into the interior space defined by the base 2A and the cap 4A can be favorably suppressed.

The laser module according to the present disclosure is not limited to the above-described embodiments and modifications, and various other modifications are possible. The above-described embodiment and the above-described modifications may be appropriately combined. For example, the aspect of the first modification or the second modification of the first embodiment may be applied to the second to fourth embodiments, or the first embodiment and the second embodiment may be combined. In a case where the above-described embodiment and the above-described modifications are appropriately combined, the laser module may be provided with a cover material that is a single layer or may be provided with a plurality of layered cover materials.

In the first embodiment and the first and second modifications, the organic adhesive layer is sealed by the cover material, the carrier, and the LD, but the present disclosure is not limited to this. A part of the organic adhesive layer may be exposed from the cover material, the carrier, and the LD. Even in this case, it is possible to suppress the characteristic deterioration due to the gas of the organic compound as compared with the comparative example in which the cover material is not provided. Similarly, in the second to fourth embodiments and the like, a part of the organic adhesive layer may be exposed from the cover material.

In the above-described embodiments and the above-described modifications, the cover material is a single film-like member, but is not limited to this aspect. For example, the cover material may be a plurality of members separated from each other, or may be a film-like member provided with holes or the like.

In the first embodiment and the modifications, the cover material covers the exposed portion of the organic adhesive layer that fixes the carrier and the LD, but the present disclosure is not limited to this. For example, in the above-described embodiment and the above-described modifications, the cover material may cover an adhesive layer other than the organic adhesive layer that fixes the LD that emits red laser light and the carrier. As a specific example, an exposed portion of the adhesive layer fixing the LD emitting the green laser light and the carrier and an exposed portion of the adhesive layer fixing the LD emitting the blue laser light and the carrier may be covered with a cover material. In this case, a single cover material may cover all exposed portions. Alternatively, a plurality of cover materials may be used.

For example, the cover material may cover an exposed portion of the adhesive layer located inside the package. As a specific example, the cover material may function to cover an exposed portion of an adhesive layer used to secure the TEC and the base. In this case, the cover material covering the exposed portion of the organic adhesive layer and the cover material covering the exposed portion of the adhesive layer may be integrated with each other or may be separated from each other. The cover material may cover an exposed portion of the adhesive layer used to fix the carrier and the thermistor.

In the above first to third embodiments and the above modifications, the laser module includes three LDs, but the number of LDs of the laser module is not limited to three. The laser module may include one or two LDs, or may include four or more LDs. Even in the above case, when the laser module includes an LD having an emission wavelength of 500 nm or less, the deterioration of the characteristics of the LD can be favorably suppressed. On the other hand, in the fourth embodiment, one LD is mounted on the carrier, but a plurality of LDs may be mounted on a plurality of carriers.

In the above-described embodiment and the above-described modification, a device other than the light source portion may be accommodated in the package of the laser module. For example, a MEMS, a photodiode (PD), and the like may be accommodated in a package.

DESCRIPTION OF REFERENCE SIGNS 1,1A laser module
2, 2A base
2a primary face
3, 3A light source portion
4, 4A cap
4a opening
5, 5A lead pin
6a main portion
6b protrusion
7a cover
7b cover glass
11 TEC
12a, 12b substrate
12c thermoelectric element
13, 13A, 13B carrier
13a first portion
13b second portion
14, 15, 16, 71, 114 laser diode (LD)
14a, 15a, 16a submount
14b, 15b, 16b laser oscillator
17 thermistor
18, 19, 20 lens
18a, 19a, 20a lens function region
18b, 19b, 20b holding region
21 multiplex optical system
22, 23, 24 wavelength selection filter
31, 31A, 51, 53, 61 organic adhesive layer
31a, 51a, 53a, 61a exposed portion
31b exposed face
32, 32A, 32B, 52, 54, 62 cover material
41, 42, 43, 44, 45, 46 data
114a portion
115 stack
116 silicon oxide film
L laser light
$L_1$. red laser light
$L_2$ green laser light
$L_3$ Blue laser light.

The invention claimed is:

1. A laser module comprising:
a base;
a carrier mounted on the base;
a laser diode mounted on the carrier;
an organic adhesive layer provided between the laser diode and the carrier, the organic adhesive layer having an exposed portion exposed between the laser diode and the carrier;
a cap fixed to the base, the cap covering the carrier, the laser diode, and the organic adhesive layer; and
a cover material covering at least a part of the exposed portion of the organic adhesive layer, the cover material being a film member,
wherein the cover material is in direct contact with the laser diode, the carrier and the organic adhesive layer.

2. The laser module according to claim 1, wherein an emission wavelength of the laser diode is 500nm or less.

3. A laser module comprising:
a base;
a carrier mounted on the base;
a laser diode mounted on the carrier;
an organic adhesive layer provided between the carrier and the base, the organic adhesive layer having an exposed portion exposed between the carrier and the base;
a cap fixed to the base, the cap covering the carrier, the laser diode, and the organic adhesive layer; and
a cover material covering at least a part of the exposed portion of the organic adhesive layer, the cover material being a film member,
wherein the cover material is in direct contact with the carrier, the base and the organic adhesive layer.

4. The laser module according to claim 3, wherein the cover material covers at least a part of the base.

5. The laser module according to claim 3, wherein a temperature adjust element is provided in the carrier.

6. A laser module comprising:
a base;
a carrier mounted on the base;
a laser diode mounted on the carrier;
an optical element mounted on the carrier;
an organic adhesive layer provided between the optical element and the carrier, the organic adhesive layer having an exposed portion exposed between the optical element and the carrier;
a cap fixed to the base, the cap covering the carrier, the laser diode, the optical element, and the organic adhesive layer; and
a cover material covering at least a part of the exposed portion of the organic adhesive layer, the cover material being a film member,
wherein the cover material is in direct contact with the optical element, the carrier and the organic adhesive layer.

7. The laser module according to claim 1, wherein the cover material also covers at least a part of the carrier.

8. The laser module according to claim 1, wherein the cover material covers whole of the exposed portion of the organic adhesive layer.

9. The laser module according to claim 1, wherein the cover material includes silicon oxide.

10. The laser module according to claim 9,
wherein the organic adhesive layer includes an organic compound including at least one of Si and O, and
wherein the silicon oxide includes at least one of Si and O included in the organic compound.

11. The laser module according to claim 3, wherein the cover material also covers at least a part of the carrier.

12. The laser module according to claim 3, wherein the cover material covers whole of the exposed portion of the organic adhesive layer.

13. The laser module according to claim 3, wherein the cover material includes silicon oxide.

14. The laser module according to claim 13,
wherein the organic adhesive layer includes an organic compound including at least one of Si and O, and
wherein the silicon oxide includes at least one of Si and O included in the organic compound.

15. The laser module according to claim 6, wherein the cover material also covers at least a part of the carrier.

16. The laser module according to claim 6, wherein the cover material covers whole of the exposed portion of the organic adhesive layer.

17. The laser module according to claim 6, wherein the cover material includes silicon oxide.

18. The laser module according to claim 17,
wherein the organic adhesive layer includes an organic compound including at least one of Si and O, and
wherein the silicon oxide includes at least one of Si and O included in the organic compound.

* * * * *